(12) United States Patent
Jang et al.

(10) Patent No.: US 9,947,733 B2
(45) Date of Patent: Apr. 17, 2018

(54) ORGANIC LIGHT EMITTING DISPLAY DEVICE HAVING CATHODE ELECTRODE CONNECTED WITH AN AUXILIARY ELECTRODE VIA A GAP SPACE BETWEEN THE FIRST AND SECOND BANKS

(71) Applicant: LG Display Co., Ltd., Seoul (KR)

(72) Inventors: Jin-Hee Jang, Seoul (KR); SeJune Kim, Paju-si (KR); SoJung Lee, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/377,656

(22) Filed: Dec. 13, 2016

(65) Prior Publication Data

US 2017/0179208 A1    Jun. 22, 2017

(30) Foreign Application Priority Data

Dec. 17, 2015 (KR) ........................ 10-2015-0181241

(51) Int. Cl.
| | |
|---|---|
| H01L 27/32 | (2006.01) |
| H01L 51/00 | (2006.01) |
| H01L 51/52 | (2006.01) |
| H01L 51/56 | (2006.01) |

(52) U.S. Cl.
CPC ...... *H01L 27/3246* (2013.01); *H01L 51/0023* (2013.01); *H01L 51/5203* (2013.01); *H01L 51/5228* (2013.01); *H01L 51/56* (2013.01)

(58) Field of Classification Search
CPC ............. H01L 27/3245; H01L 27/3248; H01L 51/5068; H01L 51/5084; H01L 51/5206; H01L 51/5228
See application file for complete search history.

(56) References Cited

U.S. PATENT DOCUMENTS

| | | |
|---|---|---|
| 2014/0312323 A1 | 10/2014 | Park et al. |
| 2015/0097171 A1 | 4/2015 | Kim et al. |
| 2015/0137097 A1* | 5/2015 | Choi ............... H01L 27/3258 257/40 |
| 2015/0144902 A1 | 5/2015 | Do et al. |

FOREIGN PATENT DOCUMENTS

| | | |
|---|---|---|
| EP | 3098872 A1 | 11/2016 |
| EP | 3125294 A1 | 2/2017 |

\* cited by examiner

*Primary Examiner* — Hoai V Pham
(74) *Attorney, Agent, or Firm* — Birch, Stewart, Kolasch & Birch, LLP

(57) ABSTRACT

An organic light emitting display device can include a substrate; an anode electrode on the substrate; an organic emitting layer on the anode electrode; a cathode electrode on the organic emitting layer; an auxiliary electrode connected with the cathode electrode; a first bank on an upper surface of the auxiliary electrode; and a second bank disposed between the auxiliary electrode and the anode electrode, in which the second bank is formed of a same material as the first bank, and the first and second banks are spaced apart from each other, and a width of an upper surface of the first bank is larger than a width of a lower surface of the first bank, and the cathode electrode is connected with the auxiliary electrode via a gap space between the first bank and the second bank.

17 Claims, 7 Drawing Sheets

ORGANIC LIGHT EMITTING DISPLAY DEVICE HAVING CATHODE ELECTRODE CONNECTED WITH AN AUXILIARY ELECTRODE VIA A GAP SPACE BETWEEN THE FIRST AND SECOND BANKS

CROSS REFERENCE TO RELATED APPLICATIONS

This application claims the benefit of the Korean Patent Application No. 10-2015-0181241 filed in the Republic of Korea on Dec. 17, 2015, which is hereby incorporated by reference as if fully set forth herein.

BACKGROUND OF THE INVENTION

Field of the Disclosure

Embodiments of the present invention relate to an organic light emitting display device, and more particularly, to a top emission type organic light emitting display device, and a method of manufacturing the same.

Discussion of the Related Art

An organic light emitting display (OLED) device, which is a self-light emitting display device, has advantages of low power consumption, rapid response speed, high emission efficiency, high luminance and wide viewing angle.

According to the direction of light emitted from an organic light emitting device, the OLED device may be generally classified into a top emission type and a bottom emission type. In the bottom emission type, a circuit device is disposed between an emitting layer and an image displaying surface, which may lower an aperture ratio of the OLED device. In the top emission type, a circuit device is not disposed between an emitting layer and an image displaying surface, thus an aperture ratio may be improved when compared to the bottom emission type.

FIG. 1 is a cross sectional view of a related art top emission type OLED device.

As shown in FIG. 1, a thin film transistor layer (T) including an active layer 11, a gate insulating film 12, a gate electrode 13, an insulating interlayer 14, a source electrode 15, and a drain electrode 16 is provided on a substrate 10, and then a passivation layer 20 and a planarization layer 30 are sequentially provided on the thin film transistor layer (T).

Also, an anode electrode 40 and an auxiliary electrode 50 are provided on the planarization layer 30. The auxiliary electrode 50 is provided to lower a resistance of a cathode electrode 90. In the top emission type, light emitted from an organic emitting layer 80 passes through the cathode electrode 90. In this reason, the cathode electrode 90 is formed of a transparent conductive material, which causes the increase of resistance therein. In order to lower the resistance of the cathode electrode 90, the cathode electrode 90 is connected with the auxiliary electrode 50.

On the anode electrode 40 and the auxiliary electrode 50, a bank 60 is provided to define a pixel region. Also, the organic emitting layer 80 is provided in the pixel region defined by the bank 60.

If the auxiliary electrode 50 is covered by the organic emitting layer 80, an electrical connection between the cathode electrode 90 and the auxiliary electrode 50 becomes difficult. Thus, in order to prevent the auxiliary electrode 50 from being covered by the organic emitting layer 80, a partition 70 is provided on the auxiliary electrode 50. The partition 70 is spaced apart from the bank 60, whereby the auxiliary electrode 50 and the cathode electrode 90 are connected to each other via a space between the partition 70 and the bank 60.

The partition 70 can include a first partition 71 and a second partition 72, in which the partition 70 is formed in a structure of eaves. Thus, according as the organic emitting layer 80 with superior straightness for the properties of process is blocked by the partition 70, it is possible to prevent the organic emitting layer 80 from being permeated into the space between the partition 70 and the bank 60. Meanwhile, the cathode electrode 90 with inferior straightness for the properties of process permeates into the space between the partition 70 and the bank 60, and is then connected to the auxiliary electrode 50.

In the related art top emission type OLED device, the partition 70 is provided to allow an electrical connection between the cathode electrode 90 and the auxiliary electrode 50. Accordingly, an additional mask process for forming the partition 70 is carried out, thereby causing a lower yield.

SUMMARY OF THE INVENTION

Accordingly, embodiments of the present invention are directed to a top emission type organic light emitting display device that substantially obviates one or more problems due to limitations and disadvantages of the related art, and a method of manufacturing the same.

An aspect of embodiments of the present invention is directed to providing a top emission type organic light emitting display device which enables an electrical connection between a cathode electrode and an auxiliary electrode without forming an additional partition, and a method of manufacturing the same.

Additional advantages and features of embodiments of the invention will be set forth in part in the description which follows and in part will become apparent to those having ordinary skill in the art upon examination of the following or may be learned from practice of embodiments of the invention. The objectives and other advantages of embodiments of the invention may be realized and attained by the structure particularly pointed out in the written description and claims hereof as well as the appended drawings.

To achieve these and other advantages and in accordance with the purpose of embodiments of the invention, as embodied and broadly described herein, there is provided an organic light emitting display device that can include anode and cathode electrodes on a substrate, an organic emitting layer provided between the anode electrode and the cathode electrode, an auxiliary electrode connected with the cathode electrode, a first bank on the auxiliary electrode, and a second bank between the auxiliary electrode and the anode electrode, in which the first and second banks are spaced from each other, and a width in an upper surface of the first bank is larger than a width in a lower surface of the first bank, and the cathode electrode is connected with the auxiliary electrode via a gap space between the first bank and the second bank.

In another aspect of an embodiment of the present invention, there is provided a method of manufacturing an organic light emitting display device that can include providing an anode electrode and an auxiliary electrode on a substrate, providing a first bank on the auxiliary electrode, and providing a second bank between the auxiliary electrode and the anode electrode, in which the second bank is spaced from the first bank, providing an organic emitting layer on the anode electrode, and providing a cathode electrode on the organic emitting layer, and a width in an upper surface of the first bank is larger than a width in a lower surface of the first bank, and the cathode electrode is connected with the auxiliary electrode via a gap space between the first bank and the second bank.

It is to be understood that both the foregoing general description and the following detailed description of embodiments of the present invention are exemplary and explanatory and are intended to provide further explanation of the invention as claimed.

BRIEF DESCRIPTION OF THE DRAWINGS

The accompanying drawings, which are included to provide a further understanding of embodiments of the invention and are incorporated in and constitute a part of this application, illustrate embodiment(s) of the invention and together with the description serve to explain the principle of embodiments of the invention. In the drawings.

DETAILED DESCRIPTION OF THE INVENTION

Figure 1:
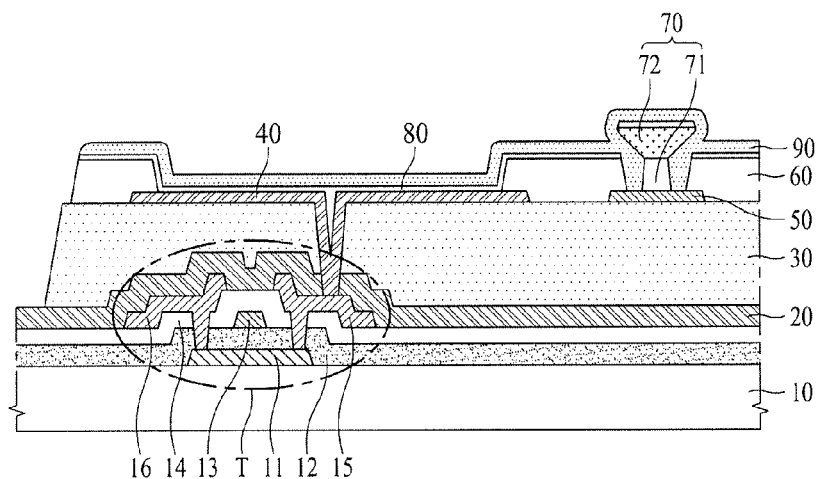
FIG. 1 is a cross sectional view illustrating a related art top emission type organic light emitting display device.

Reference will now be made in detail to the exemplary embodiments of the present invention, examples of which are illustrated in the accompanying drawings. Wherever possible, the same reference numbers will be used throughout the drawings to refer to the same or like parts. Advantages and features of the present invention, and implementation methods thereof will be clarified through following embodiments described with reference to the accompanying drawings. The present invention can, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims.

A shape, a size, a ratio, an angle, and a number disclosed in the drawings for describing embodiments of the present invention are merely an example, and thus, the present invention is not limited to the illustrated details. Like reference numerals refer to like elements throughout. In the following description, when the detailed description of the relevant known function or configuration is determined to unnecessarily obscure the important point of the present invention, the detailed description will be omitted. In a case where "comprise," "have" and "include" are described in the present specification are used, another part may be added unless "only" is used. The terms of a singular form can include plural forms unless referred to the contrary.

In construing an element, the element is construed as including an error region although there is no explicit description.

In description of embodiments of the present invention, when a structure (for example, an electrode, a line, a wiring, a layer, or a contact) is described as being formed at an upper portion/lower portion of another structure or on/under the other structure, this description should be construed as including a case where the structures contact each other and moreover, a case where a third structure is disposed therebetween.

In describing a temporal relationship, for example, when the temporal order is described as "after," "subsequent," "next" and "before" the order may not be continuous unless "just" or "directly" is used.

It will be understood that, although the terms "first," "second," etc. may be used herein to describe various elements, these elements should not be limited by these terms. These terms are only used to distinguish one element from another. For example, a first element could be termed a second element, and similarly, a second element could be termed a first element, without departing from the scope of the present invention.

Features of various embodiments of the present invention can be partially or overall coupled to or combined with each other, and can be variously inter-operated with each other and driven technically as those skilled in the art can sufficiently understand. The embodiments of the present invention may be carried out independently from each other, or can be carried out together in co-dependent relationship.

Hereinafter, an organic light emitting display device according to embodiments of the present invention will be described in detail with reference to the accompanying drawings.

Figure 2:
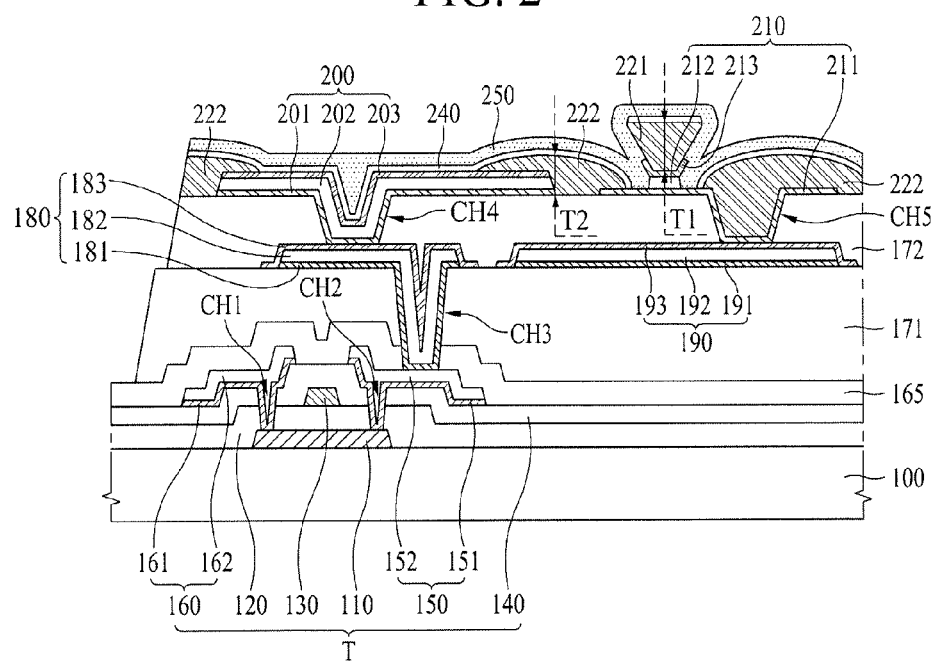
FIG. 2 is a cross sectional view illustrating an organic light emitting display device according to an embodiment of the present invention.

FIG. 2 is a cross sectional view illustrating an organic light emitting display device according to one embodiment of the present invention.

As shown in FIG. 2, the organic light emitting display (OLED) device according to one embodiment of the present invention can include a substrate 100, a thin film transistor layer (T), a passivation layer 165, a first planarization layer 171, a second planarization layer 172, a first anode electrode 180, a second anode electrode 200, a first auxiliary electrode 190, a second auxiliary electrode 210, banks 221 and 222, an organic emitting layer 240, and a cathode electrode 250.

The substrate 100 may be formed of glass or transparent plastic, but the substrate 100 is not limited to these materials.

The thin film transistor layer (T) can include an active layer 110, a gate insulating film 120, a gate electrode 130, an insulating interlayer 140, a source electrode 150, and a drain electrode 160.

The active layer 110 is provided on the substrate 100, in which the active layer 110 overlaps with the gate electrode 130. The active layer 110 may be formed a silicon-based semiconductor material or oxide-based semiconductor material. Also, a light shielding layer may be additionally provided between the substrate 100 and the active layer 110. In this instance, external light, which is incident on a lower surface of the substrate 100, is blocked by the light shielding layer so that it is possible to prevent the active layer 110 from being damaged by the external light.

The gate insulating film 120 is provided on the active layer 110. The gate insulating film 120 insulates the active layer 110 and the gate electrode 130 from each other. For example, the gate insulating film 120 can be formed of an inorganic insulating material, and more particularly, the gate insulating film 120 can be formed in a single-layered structure of the inorganic insulating material such as silicon oxide SiOx or silicon nitride SiNx, or a multi-layered structure of the above silicon oxide SiOx and silicon nitride SiNx, but not limited to these structures.

The gate electrode 130 is provided on the gate insulating film 120. The gate electrode 130 overlaps with the active layer 110, wherein the gate insulating film 120 is interposed between the gate electrode 130 and the active layer 110 being overlapped with each other. The gate electrode 130 can be formed in a single-layered structure or multi-layered structure among molybdenum (Mo), aluminum (AI), chrome (Cr), aurum (Au), titanium (Ti), nickel (Ni), neodymium (Nd), copper (Cu) and their alloys, but not limited to these materials.

The insulating interlayer 140 is provided on the gate electrode 130. The insulating interlayer 140 is formed of the same material as that of the gate insulating film 120. For example, the insulating interlayer 140 can be formed in a single-layered structure of the inorganic insulating material such as silicon oxide SiOx or silicon nitride SiNx, or a multi-layered structure of the above silicon oxide SiOx and silicon nitride SiNx, but not limited to these materials and structures.

The source electrode 150 and the drain electrode 160 confronting each other are provided on the insulating interlayer 140. A first contact hole (CH1) for exposing one end of the active layer 110 is provided in the aforementioned gate insulating film 120 and the insulating interlayer 140, and a second contact hole (CH2) for exposing the other end of the active layer 110 is provided in the aforementioned gate insulating film 120 and the insulating interlayer 140. The source electrode 150 is connected to the other end of the active layer 110 via the second contact hole (CH2), and the drain electrode 160 is connected to one end of the active layer 110 via the first contact hole (CH1).

The source electrode 150 can include a lower source electrode 151 and an upper source electrode 152.

The lower source electrode 151 is provided between the insulating interlayer 140 and the upper source electrode 152, in which the lower source electrode 151 enhances an adhesive strength between the insulating interlayer 140 and the upper source electrode 152. Also, the lower source electrode 151 protects a lower surface of the upper source electrode 152 so that it is possible to prevent the lower surface of the upper source electrode 152 from being corroded. Thus, an oxidation degree of the lower source electrode 151 can be lower than an oxidation degree of the upper source electrode 152. That is, a corrosion resistance in a material of the lower source electrode 151 can be superior to a corrosion resistance in a material of the upper source electrode 152. The lower source electrode 151 functions as an adhesion enhancement layer or a corrosion preventing layer. The lower source electrode 151 can be formed of an alloy MoTi of molybdenum and titanium, but not limited to this material.

The upper source electrode 152 is provided on an upper surface of the lower source electrode 151. The upper source electrode 152 can be formed of a low-resistance metal material such as copper Cu, but not limited to this metal material. The upper source electrode 152 can be formed of a metal material whose resistance is relatively lower than that of the lower source electrode 151. In order to lower a total resistance of the source electrode 150, a thickness of the upper source electrode 152 is larger than a thickness of the lower source electrode 151, preferably.

In the same way as the aforementioned source electrode 150, the drain electrode 160 can include a lower drain electrode 161 and an upper drain electrode 162.

The lower drain electrode 161 is provided between the insulating interlayer 140 and the upper drain electrode 162, in which the lower drain electrode 161 enhances an adhesive strength between the insulating interlayer 140 and the upper drain electrode 162. Also, the lower drain electrode 161 prevents a lower surface of the upper drain electrode 162 from being corroded. Thus, an oxidation degree of the lower drain electrode 161 can be lower than an oxidation degree of the upper drain electrode 162. That is, a corrosion resistance in a material of the lower drain electrode 161 can be superior to a corrosion resistance in a material of the upper drain electrode 162. The lower drain electrode 161 can be formed of the same material as that of the aforementioned lower source electrode 151, that is, alloy MoTi of molybdenum and titanium, but not limited to this material.

The upper drain electrode 162 is provided on an upper surface of the lower drain electrode 161. The upper drain electrode 162 can be formed of the same material as that of the aforementioned upper source electrode 152, for example, copper Cu, but not limited to this material. In order to lower a total resistance of the drain electrode 160, a thickness of the upper drain electrode 162 is larger than a thickness of the lower drain electrode 161, preferably.

The upper drain electrode 162 can be formed of the same material as that of the upper source electrode 152, and the upper drain electrode 162 can be formed in the same thickness as that of the upper source electrode 152. The lower drain electrode 161 can be formed of the same material as that of the lower source electrode 151, and the lower drain electrode 161 can be formed in the same thickness as that of the lower source electrode 151. In this instance, the drain electrode 160 and the source electrode 150 may be manufactured at the same time by the same process.

A structure of the thin film transistor layer (T) is not limited to the above structure, that is, a structure of the thin film transistor layer (T) can be changed to various shapes generally known to those in the art. For example, the drawing shows a top gate structure where the gate electrode 130 is provided over the active layer 110, but not necessarily. That is, it is possible to provide a bottom gate structure where the gate electrode 130 is provided below the active layer 110.

The passivation layer 165 is provided on the thin film transistor layer (T), and more particularly, on upper surfaces of the source electrode 150 and the drain electrode 160. The passivation layer 165 protects the thin film transistor layer (T). The passivation layer 165 can be formed of an inorganic insulating material, for example, silicon oxide film SiOx or silicon nitride film SiNx, but not limited to these materials.

The first planarization layer 171 is provided on the passivation layer 165. The first planarization layer 171 is provided to planarize an upper surface of the substrate 100 with the thin film transistor layer (T). The first planarization layer 171 can be formed of an organic insulating material, for example, acryl resin, epoxy resin, phenolic resin, polyamide resin, polyimide resin, and etc., but not limited to these materials.

The first anode electrode 180 and the first auxiliary electrode 190 are provided on the first planarization layer 171. That is, the first anode electrode 180 and the first auxiliary electrode 190 are formed in the same layer. A third contact hole (CH3) for exposing the source electrode 150 is provided in the aforementioned passivation layer 165 and the first planarization layer 171. The source electrode 150 and the first anode electrode 180 are connected to each other via the third contact hole (CH3). If needed, the third contact hole (CH3) can expose the drain electrode 160, whereby the drain electrode 160 and the first anode electrode 180 can be connected to each other via the third contact hole (CH3).

The first anode electrode 180 can include a first lower anode electrode 181, a first upper anode electrode 182, and a first cover anode electrode 183.

The first lower anode electrode 181 is provided between the planarization layer 170 and the first upper anode electrode 182, in which the first lower anode electrode 181 enhances an adhesive strength between the planarization layer 170 and the first upper anode electrode 182. Also, the first lower anode electrode 181 protects a lower surface of the first upper anode electrode 182, to thereby prevent the lower surface of the first upper anode electrode 182 from being corroded. Thus, an oxidation degree of the first lower anode electrode 181 can be lower than an oxidation degree of the first upper anode electrode 182. That is, a corrosion resistance in a material of the first lower anode electrode 181 can be superior to a corrosion resistance in a material of the first upper anode electrode 182. Also, the first lower anode electrode 181 protects an upper surface of the upper source electrode 152, to thereby prevent the upper surface of the upper source electrode 152 from being corroded. Thus, an oxidation degree of the first lower anode electrode 181 can be lower than an oxidation degree of the upper source electrode 152. That is, a corrosion resistance in a material of the first lower anode electrode 181 can be superior to a corrosion resistance in a material of the upper source electrode 152. Accordingly, it is possible to provide the aforementioned dual-layered structure in the source electrode 150 so the first lower anode electrode 180 prevents the upper surface of the upper source electrode 152 from becoming corroded. The first lower anode electrode 181 functions as an adhesion enhancement layer and/or a corrosion preventing layer. The first lower anode electrode 181 can be formed of an alloy MoTi of molybdenum and titanium, but not limited to this material.

The first upper anode electrode 182 is provided between the first lower anode electrode 181 and the first cover anode electrode 183. The first upper anode electrode 182 can be formed of a low-resistance metal material such as copper Cu, but not limited to this metal material. The first upper anode electrode 182 can be formed of a metal material whose resistance is relatively lower than that of the first lower anode electrode 181 and the first cover anode electrode 183. In order to lower a total resistance of the first anode electrode 180, a thickness of the first upper anode electrode 182 is larger than a thickness of each of the first lower anode electrode 181 and the first cover anode electrode 183, preferably.

The first cover anode electrode 183 is provided on the first upper anode electrode 182. The first cover anode electrode 183 covers the upper and lateral surfaces of the first upper anode electrode 182 so that it is possible to prevent the upper and lateral surfaces of the first upper anode electrode 182 from being corroded. Thus, an oxidation degree of the first cover anode electrode 183 can be lower than an oxidation degree of the first upper anode electrode 182. That is, a corrosion resistance in a material of the first cover anode electrode 183 can be superior to a corrosion resistance in a material of the first upper anode electrode 182.

The first cover anode electrode 183 can cover the lateral surface of the first lower anode electrode 181. In this instance, an oxidation degree of the first cover anode electrode 183 can be lower than an oxidation degree of the first lower anode electrode 181. That is, a corrosion resistance in a material of the first cover anode electrode 183 can be superior to a corrosion resistance in a material of the first lower anode electrode 181. The first cover anode electrode 183 can be formed of a transparent conductive material, for example, indium-tin-oxide ITO, but not limited to this material.

In the same manner as the first anode electrode 180, the first auxiliary electrode 190 can include a first lower auxiliary electrode 191, a first upper auxiliary electrode 192, and a first cover auxiliary electrode 193.

The first lower auxiliary electrode 191 is provided between the planarization layer 170 and the first upper auxiliary electrode 192, in which the first lower auxiliary electrode 191 enhances an adhesive strength between the planarization layer 170 and the first upper auxiliary electrode 192. Also, the first lower auxiliary electrode 191 prevents a lower surface of the first upper auxiliary electrode 192 from being corroded. Thus, an oxidation degree of the first lower auxiliary electrode 191 can be lower than an oxidation degree of the first upper auxiliary electrode 192. That is, a corrosion resistance in a material of the first lower auxiliary electrode 191 can be superior to a corrosion resistance in a material of the first upper auxiliary electrode 192. The first lower auxiliary electrode 191 can be formed of the same material as that of the first lower anode electrode 181, that is, alloy MoTi of molybdenum and titanium, but not limited to this material.

The first upper auxiliary electrode 192 is provided between the first lower auxiliary electrode 191 and the first cover auxiliary electrode 193. The first upper auxiliary electrode 192 can be formed of the same material as that of the first upper anode electrode 182, that is, copper Cu, but not limited to this material. In order to reduce a total resistance of the first auxiliary electrode 190, a thickness of the first upper auxiliary electrode 192 with the relatively-low resistance is larger than a thickness of each of the first lower auxiliary electrode 191 and the first cover auxiliary electrode 193 with the relatively-high resistance, preferably.

The first cover auxiliary electrode 193 is provided on the first upper auxiliary electrode 192. The first cover auxiliary electrode 193 covers the upper and lateral surfaces of the first upper auxiliary electrode 192 so that it is possible to prevent the upper and lateral surfaces of the first upper auxiliary electrode 192 from being corroded. Thus, an oxidation degree of the first cover auxiliary electrode 193 can be lower than an oxidation degree of the first upper auxiliary electrode 192. That is, a corrosion resistance in a material of the first cover auxiliary electrode 193 can be superior to a corrosion resistance in a material of the first upper auxiliary electrode 192.

The first cover auxiliary electrode 193 can cover the lateral surface of the first lower auxiliary electrode 191. In this instance, an oxidation degree of the first cover auxiliary electrode 193 can be lower than an oxidation degree of the first lower auxiliary electrode 191. That is, a corrosion resistance in a material of the first cover auxiliary electrode 193 can be superior to a corrosion resistance in a material of the first lower auxiliary electrode 191. The first cover auxiliary electrode 193 can be formed of a transparent conductive material, for example, indium-tin-oxide ITO, but not limited to this material.

The first cover auxiliary electrode 193 can be formed of the same material as that of the first cover anode electrode 183, and the first cover auxiliary electrode 193 can be manufactured in the same thickness as that of the first cover anode electrode 183. The first upper auxiliary electrode 192 can be formed of the same material as that of the first upper anode electrode 182, and the first upper auxiliary electrode 192 can be manufactured in the same thickness as that of the first upper anode electrode 182. The first lower auxiliary electrode 191 can be formed of the same material as that of the first lower anode electrode 181, and the first lower auxiliary electrode 191 can be manufactured in the same thickness as that of the first lower anode electrode 181. In this instance, the first auxiliary electrode 190 and the first anode electrode 180 may be manufactured at the same time by the same process.

The second planarization layer 172 is provided on the first auxiliary electrode 190 and the first anode electrode 180. The second planarization layer 172 together with the aforementioned first planarization layer 171 is provided to planarize the upper surface of the substrate 100. The second planarization layer 172 can be formed of an organic insulating material, for example, acryl resin, epoxy resin, phenolic resin, polyamide resin, polyimide resin, and etc., but not limited to these materials.

A fourth contact hole (CH4) and a fifth contact hole (CH5) are provided in the second planarization layer 172. The first anode electrode 180 is exposed via the fourth contact hole (CH4), and the first auxiliary electrode 190 is exposed via the fifth contact hole (CH5).

The second anode electrode 200 is provided on the second planarization layer 172. The second anode electrode 200 is connected to the first anode electrode 180 via the fourth contact hole (CH4). The second anode electrode 200 reflects light emitted from the organic emitting layer 240 to an upper direction, whereby the second anode electrode 200 includes a material with good reflectance. The second anode electrode 200 can include a second lower anode electrode 201, a second central anode electrode 202, and a second upper anode electrode 203.

The second lower anode electrode 201 is provided between the first anode electrode 180 and the second central anode electrode 202. The second lower anode electrode 201 protects a lower surface of the second central anode electrode 202, to thereby prevent the lower surface of the second central anode electrode 202 from being corroded. Thus, an oxidation degree of the second lower anode electrode 201 can be lower than an oxidation degree of the second central anode electrode 202. That is, a corrosion resistance in a material of the second lower anode electrode 201 can be superior to a corrosion resistance in a material of the second central anode electrode 202. The second lower anode electrode 201 can be formed of a transparent conductive material such as indium-tin-oxide ITO, but not limited to this material.

The second central anode electrode 202 is provided between the second lower anode electrode 201 and the second upper anode electrode 203. The second central anode electrode 202 is formed of a material with relatively-low resistance and relatively-high reflectance in comparison to the second lower anode electrode 201 and the second upper anode electrode 203, for example, argentums Ag, but not limited to this material. In order to lower a total resistance of the second anode electrode 200, a thickness of the second central anode electrode 202 with relatively-low resistance is larger than a thickness in each of the second lower anode electrode 201 and the second upper anode electrode 203 with relatively-high resistance, preferably.

The second upper anode electrode 203 is provided on an upper surface of the second central anode electrode 202 so that it is possible to prevent the upper surface of the second central anode electrode 202 from being corroded. Thus, an oxidation degree of the second upper anode electrode 203 can be lower than an oxidation degree of the second central anode electrode 202. That is, a corrosion resistance in a material of the second upper anode electrode 203 can be superior to a corrosion resistance in a material of the second central anode electrode 202. The second upper anode electrode 203 can be formed of a transparent conductive material such as indium-tin-oxide ITO, but not limited to this material.

In the same way as the aforementioned second anode electrode 200, the second auxiliary electrode 210 is provided on the second planarization layer 172. The second auxiliary electrode 210 is connected to the first auxiliary electrode 190 via the fifth contact hole (CH5). The second auxiliary electrode 210 together with the first auxiliary electrode 190 lowers a resistance of the cathode electrode 250. Also, the second auxiliary electrode 210 prepares a gap space between the first bank 221 and the second bank 222.

The second auxiliary electrode 210 can include a second lower auxiliary electrode 211, a second central auxiliary electrode 212, and a second upper auxiliary electrode 213.

The second lower auxiliary electrode 211 is provided between the first auxiliary electrode 190 and the second central auxiliary electrode 212. The second lower auxiliary electrode 211 protects a lower surface of the second central auxiliary electrode 212, to thereby prevent the lower surface of the second central auxiliary electrode 212 from being corroded. Thus, an oxidation degree of the second lower auxiliary electrode 211 can be lower than an oxidation degree of the second central auxiliary electrode 212. That is, a corrosion resistance in a material of the second lower auxiliary electrode 211 can be superior to a corrosion resistance in a material of the second central auxiliary electrode 212. The second lower auxiliary electrode 211 can be formed of a transparent conductive material, for example indium-tin-oxide ITO, but not limited to this material.

A width of the second lower auxiliary electrode 211 is larger than a width of the second central auxiliary electrode 212 and a width of the second upper auxiliary electrode 213, whereby it facilitates an electrical connection between the cathode electrode 250 and the second auxiliary electrode 210.

The second central auxiliary electrode 212 is provided between the second lower auxiliary electrode 211 and the second upper auxiliary electrode 213. The second central auxiliary electrode 212 is formed of a material with relatively-low resistance and relatively-high reflectance in comparison to the second lower auxiliary electrode 211 and the second upper auxiliary electrode 213, for example, argentums Ag, but not limited to this material. In order to lower a total resistance of the second auxiliary electrode 210, a thickness of the second central auxiliary electrode 212 with relatively-low resistance is larger than a thickness in each of the second lower auxiliary electrode 211 and the second upper auxiliary electrode 213 with relatively-high resistance, preferably.

A width of the second central auxiliary electrode 212 is smaller than a width of the second lower auxiliary electrode 211. Also, the width of the second central auxiliary electrode 212 is smaller than a width of the second upper auxiliary electrode 213. The second central auxiliary electrode 212 with the relatively-small width can increase the gap space between the first bank 221 and the second bank 222, whereby the cathode electrode 250 is easily deposited in the gap space between the first bank 221 and the second bank 222.

The second upper auxiliary electrode 213 is provided on an upper surface of the second central auxiliary electrode 212 so that it is possible to prevent the upper surface of the second central auxiliary electrode 212 from being corroded. Thus, an oxidation degree of the second upper auxiliary electrode 213 can be lower than an oxidation degree of the second central auxiliary electrode 212. That is, a corrosion resistance in a material of the second upper auxiliary electrode 213 can be superior to a corrosion resistance in a material of the second central auxiliary electrode 212. The second upper auxiliary electrode 213 can be formed of a transparent conductive material such as indium-tin-oxide ITO, but not limited to this material.

Both ends of the second upper auxiliary electrode 213 upwardly extend along a lower surface of the first bank 221 (e.g., the ends of the second upper auxiliary electrode 213 form a type of "V" shaped cup that is wrapped around the bottom tip of the first bank 221). A structure regarding the ends of the second upper auxiliary electrode 213 will be easily understood by the following manufacturing process.

The second upper auxiliary electrode 213 can be formed of the same material as that of the second upper anode electrode 203, and the second upper auxiliary electrode 213 can be manufactured in the same thickness as that of the second upper anode electrode 203. The second central auxiliary electrode 212 can be formed of the same material as that of the second central anode electrode 202, and the second central auxiliary electrode 212 can be manufactured in the same thickness as that of the second central anode electrode 202. The second lower auxiliary electrode 211 can be formed of the same material as that of the second lower anode electrode 201, and the second lower auxiliary electrode 211 can be manufactured in the same thickness as that of the second lower anode electrode 201.

According to one embodiment of the present invention, there are two auxiliary electrodes including the first auxiliary electrode 190 and the second auxiliary electrode 210 connected to each other for lowering the resistance of the cathode electrode 250, thus it is possible to easily control the resistance properties of the auxiliary electrode.

In more detail, the second auxiliary electrode 210 is formed in the same layer as the second anode electrode 200. Thus, if the width of the second auxiliary electrode 210 is increased, then the width of the second anode electrode 200 has to be decreased, which may decrease a pixel region of a display device. For this reason, there is a limit to increasing the width of the second auxiliary electrode 210. According to one embodiment of the present invention, the first auxiliary electrode 190 connected to the second auxiliary electrode 210, and provided below the second auxiliary electrode 210 so that it is possible to lower the resistance of the cathode electrode 250 without decreasing the pixel region.

The first auxiliary electrode 190 is formed in the same layer as the first anode electrode 180, in which the first anode electrode 180 connects the source electrode 150 and the second anode electrode 200 with each other. Thus, it is possible to decrease the width of the first anode electrode 180, and increase the width of the first auxiliary electrode 190. That is, the width of the first auxiliary electrode 190 can be larger than the width of the first anode electrode 180. Furthermore, since the width of the first auxiliary electrode 190 is increased, the first auxiliary electrode 190 can be overlapped with the second anode electrode 200, in order to lower the resistance of the cathode electrode 250.

The banks 221 and 222 are provided on the second anode electrode 200 and the second auxiliary electrode 210, respectively. The banks 221 and 222 may include the first bank 221 and the second bank 222. The first bank 221 and the second bank 222 are formed of the same material. The first bank 221 is provided on the upper surface of the second upper auxiliary electrode 213 of the second auxiliary electrode 210. The second bank 222 is provided on the upper surface of the second anode electrode 200, and the upper surface of the second lower auxiliary electrode 211 of the second auxiliary electrode 210. The first bank 221 and the second bank 222 are spaced apart from each other, and the second auxiliary electrode 210 and the cathode electrode 250 are electrically connected with each other in the gap space between the first bank 221 and the second bank 222.

A thickness (t2) of the second bank 222 is smaller than a thickness (t1) of the first bank 221. Since the thickness (t2) of the second bank 222 is smaller than the thickness (t1) of the first bank 221, it facilitates the electrical connection between the cathode electrode 250 and the second auxiliary electrode 210 in the gap space between the first bank 221 and the second bank 222. That is, if the thickness (t2) of the second bank 222 is large, the interval between the first bank 221 and the second bank 222 is decreased, whereby the cathode electrode 250 might be not deposited in the gap space between the first bank 221 and the second bank 222. In order to prevent this problem, the thickness (t2) of the second bank 222 is smaller than the thickness (t1) of the first bank 221.

A width in an upper surface of the first bank 221 is larger than a width in a lower surface of the first bank 221. Thus, the first bank 221 is formed in a structure of eaves. For example, the first bank 221 can have a reverse tapered shape or form a mushroom shape. From a top view, the gap space between the first bank 221 and the second bank 222 is covered by the upper surface of the first bank 221 having the structure of eaves so that it is possible to prevent the organic emitting layer 240 from being deposited in the gap space between the first bank 221 and the second bank 222 for a deposition process of the organic emitting layer 240. That is, if the upper surface of the first bank 221 serving as the eaves is configured to cover the gap space between the first bank 221 and the second bank 222, it is possible to prevent the organic emitting layer 240 from being permeated into the gap space between the first bank 221 and the second bank 222. Accordingly, the second auxiliary electrode 210 can be exposed via the gap space between the first bank 221 and the second bank 222. Especially, the organic emitting layer 240 can be manufactured by an evaporation method using a deposition material with superior straightness. Thus, the organic emitting layer 240 is not deposited in the gap space between the first bank 221 and the second bank 222 for the deposition process of the organic emitting layer 240.

The second bank 222, which exposes the upper surface of the second anode electrode 200, is provided on one side and the other side of the second anode electrode 200 (e.g., the second anode electrode 200 is between two portions of the second bank 22). Since the second bank 222 exposes the upper surface of the second anode electrode 200, it is possible to secure an image-displaying area. Also, the second bank 222 is provided on one side and the other side of the second anode electrode 200, in order to prevent the lateral surface of the second central anode electrode 202 from being exposed, in which the lateral surface of the second central anode electrode 202 is relatively vulnerable to corrosion, thereby preventing the lateral surface of the second central anode electrode 202 from being corroded.

Also, a portion of the second bank 222 is provided between the second anode electrode 200 and the second auxiliary electrode 210, in which the second bank 222 electrically insulates the second anode electrode 200 and the second auxiliary electrode 210 from each other. The first bank 221 and the second bank 222 may be formed of an organic insulating material, for example, polyimide resin, acryl resin, benzocyclobutene BCB, and etc., but not limited to these materials.

The organic emitting layer 240 is provided on the second anode electrode 200. The organic emitting layer 240 can include a hole injecting layer, a hole transporting layer, an emitting layer, an electron transporting layer, and an electron injecting layer. A structure of the organic emitting layer 240 can be changed to various shapes generally known to those in the art.

The organic emitting layer 240 can extend to the upper surface of the banks 221 and 222. Also, the organic emitting layer 240 can extend to the upper surface of the second lower auxiliary electrode 211 of the second auxiliary electrode 210. In this instance, the organic emitting layer 240 does not cover the entire upper surface of the second lower auxiliary electrode 211. If the entire upper surface of the second lower auxiliary electrode 211 is covered by the organic emitting layer 240, it is difficult to electrically connect the second auxiliary electrode 210 and the cathode electrode 250 with each other.

The cathode electrode 250 is provided on the organic emitting layer 240. As the cathode electrode 250 is provided on a surface from which light is emitted, the cathode electrode 250 is formed of a transparent conductive material. Thus, a resistance of the cathode electrode 250 is increased since the cathode electrode 250 is formed of the transparent conductive material. In order to lower the resistance of the cathode electrode 250, the cathode electrode 250 is connected to the second auxiliary electrode 210. That is, the cathode electrode 250 is connected to the second auxiliary electrode 210 via the gap space between the first bank 221 and the second bank 222. The cathode electrode 250 may be manufactured by sputtering, that is, a deposition process using a deposition material with inferior straightness. Accordingly, the cathode electrode 250 can be deposited in the gap space between the first bank 221 and the second bank 222 for the deposition process of the cathode electrode 250.

Also, an encapsulation layer for preventing a permeation of moisture can be additionally provided on the cathode electrode 250. The encapsulation layer can be formed of various materials generally known to those in the art. In addition, a color filter for each pixel can be additionally provided on the cathode electrode 250. In this instance, white light may be emitted from the organic emitting layer 240.

According to one embodiment of the present invention, instead of having an additional partition (See 70 of FIG. 1) for providing an eaves structure, the width in the upper surface of the first bank 221 on the second auxiliary electrode 210 is made larger than the width in the lower surface of the first bank 221 so that the first bank 221 is able to serve as the eaves structure. In order words, a portion of the bank can be used to form the eaves structure. Thus, it is possible to omit an additional mask process for separately forming the partition (See 70 of FIG. 1) according to the related art.

FIGS. 3A to 3K are cross sectional views illustrating a method of manufacturing the organic light emitting display device according to one embodiment of the present invention, which relate to the organic light emitting display device shown in FIG. 2. Thus, the same reference numbers will be used throughout the drawings to refer to the same or like parts, and a detailed description for the same parts will be omitted or will be brief.

Figure 3A:
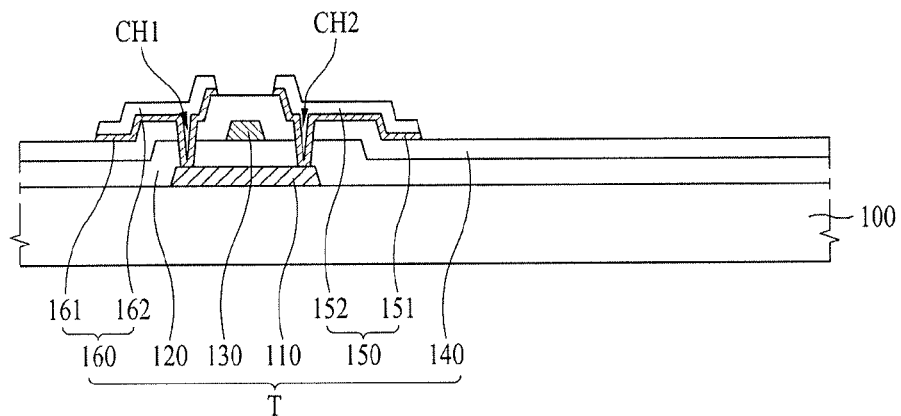
FIGS. 3A to 3K are cross sectional views illustrating a method of manufacturing the organic light emitting display device according to an embodiment of the present invention.

First, as shown in FIG. 3A, the active layer 110, the gate insulating film 120, the gate electrode 130, the insulating interlayer 140, the source electrode 150, and the drain electrode 160 are sequentially provided on the substrate 100.

In more detail, the active layer 110 is provided on the substrate 100, the gate insulating film 120 is provided on the active layer 110, the gate electrode 130 is provided on the gate insulating film 120, the insulating interlayer 140 is provided on the gate electrode 130, the first and second contact holes (CH1, CH2) are provided in the gate insulating film 120 and the insulating interlayer 140, and the drain electrode 160 connected to one end of the active layer 110 via the first contact hole (CH1) is provided and the source electrode 150 connected to the other end of the active layer 110 via the second contact hole (CH2) is provided.

The source electrode 150 can include the lower source electrode 151 and the upper source electrode 152. The drain electrode 160 can include the lower drain electrode 161 and the upper drain electrode 162.

Figure 3B:
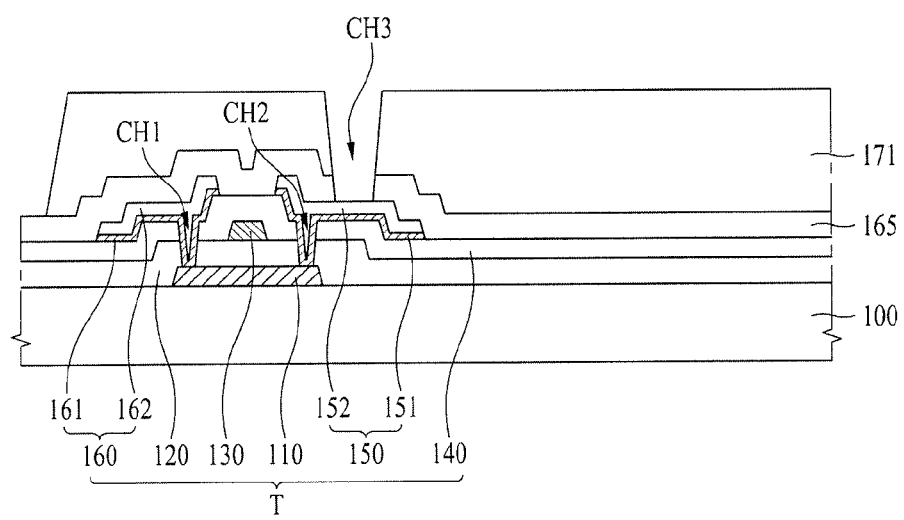

Then, as shown in FIG. 3B, the passivation layer 165 is provided on the source electrode 150 and the drain electrode 160. The first planarization layer 171 is provided on the passivation layer 165.

The third contact hole (CH3) is provided in the passivation layer 165 and the first planarization layer 171, whereby the source electrode 150 is exposed to the external via the third contact hole (CH3). If needed, the drain electrode 160 can be exposed to the external via the third contact hole (CH3).

Figure 3C:
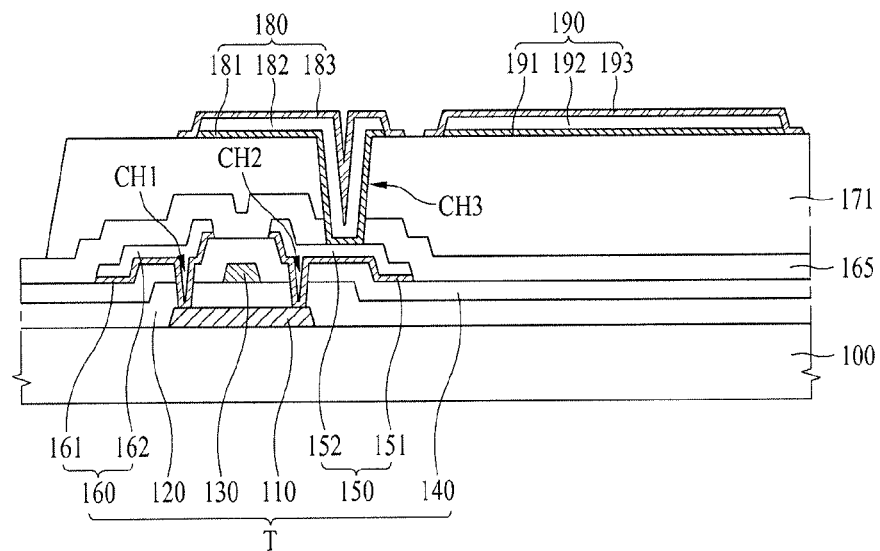

Then, as shown in FIG. 3C, the first anode electrode 180 and the first auxiliary electrode 190 are provided on the first planarization layer 171, in which the first anode electrode 180 and the first auxiliary electrode 190 are spaced apart from each other.

The first anode electrode 180 is connected with the source electrode 150 via the third contact hole (CH3). If the drain electrode 160 is exposed to the external via the third contact hole (CH3), the first anode electrode 180 is connected with the drain electrode 160 via the third contact hole (CH3).

The first anode electrode 180 can include the first lower anode electrode 181, the first upper anode electrode 182, and the first cover anode electrode 183. The first auxiliary electrode 190 can include the first lower auxiliary electrode 191, the first upper auxiliary electrode 192, and the first cover auxiliary electrode 193.

The first anode electrode 180 and the first auxiliary electrode 190 can be formed of the same material, and can be manufactured at the same time by the same patterning process.

Figure 3D:
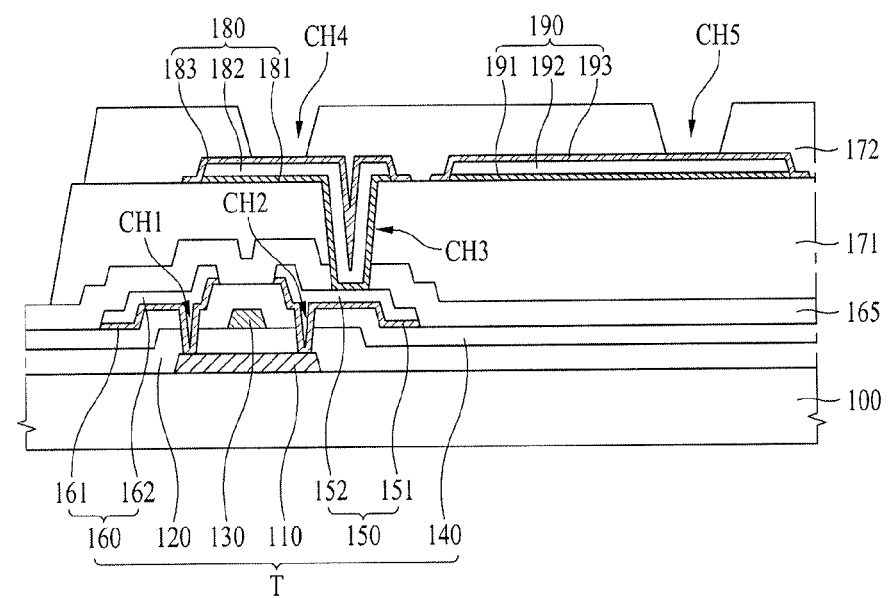

Then, as shown in FIG. 3D, the second planarization layer 172 is provided on the first anode electrode 180 and the first auxiliary electrode 190.

The fourth contact hole (CH4) and the fifth contact hole (CH5) are provided in the second planarization layer 173. The first anode electrode 180 is exposed to the external via the fourth contact hole (CH4), and the first auxiliary electrode 190 is exposed to the external via the fifth contact hole (CH5).

Figure 3E:
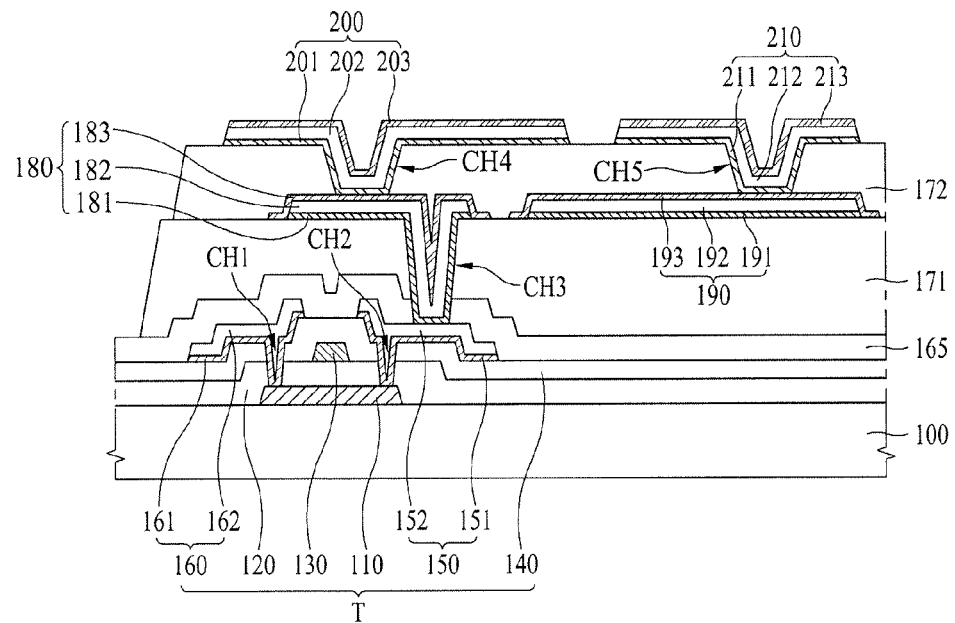

Then, as shown in FIG. 3E, the second anode electrode 200 and the second auxiliary electrode 210 are provided on the second planarization layer 172.

The second anode electrode 200 and the second auxiliary electrode 210 can be formed of the same material, and can be manufactured at the same time by the same patterning process.

The second anode electrode 200 can include the second lower anode electrode 201, the second central anode electrode 202, and the second upper anode electrode 203. The second auxiliary electrode 210 can include the second lower auxiliary electrode 211, the second central auxiliary electrode 212, and the second upper auxiliary electrode 213.

Figure 3F:
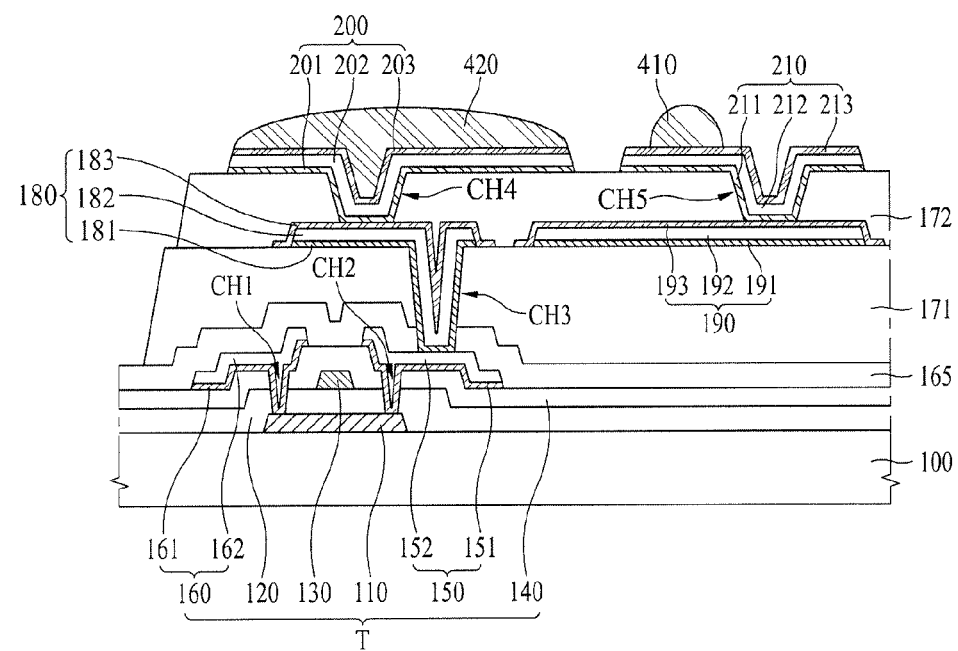

Then, as shown in FIG. 3F, photoresist patterns 410 and 420 are provided on the second anode electrode 200 and the second auxiliary electrode 210.

The photoresist patterns 410 and 420 can include the first photoresist pattern 410 provided on the second auxiliary electrode 210, and the second photoresist pattern 420 provided on the second anode electrode 200.

The first photoresist pattern 410 is provided on a predetermined portion of an upper surface of the second auxiliary electrode 210, whereby one side and the other side of the second auxiliary electrode 210 are not covered by the first photoresist pattern 410.

The second photoresist pattern 420 is provided on an entire upper surface of the second anode electrode 200, whereby an entire portion of the second anode electrode 200 is covered by the second photoresist pattern 420.

Figure 3G:
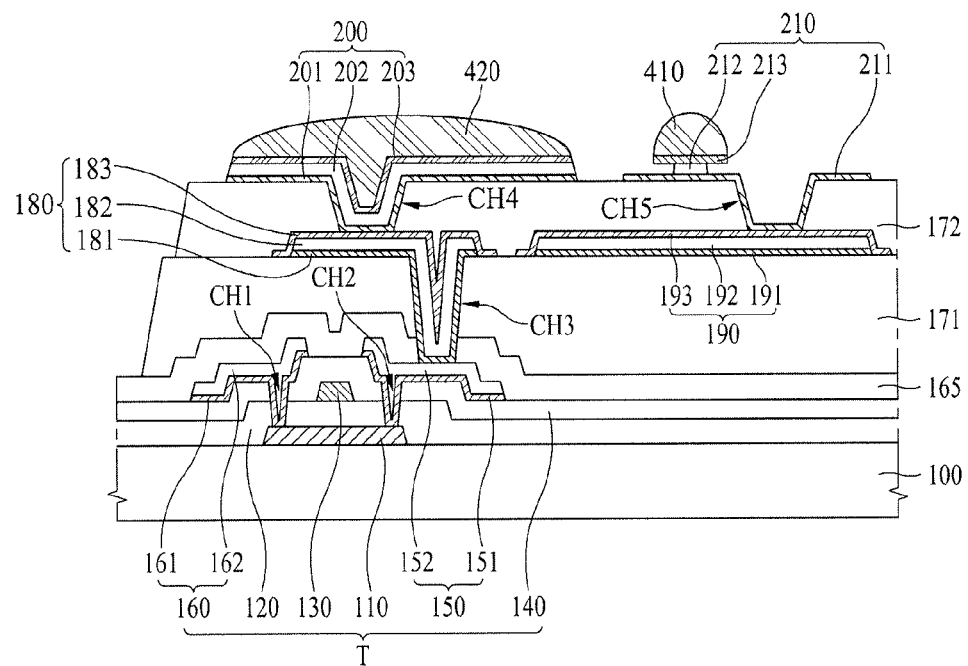

As shown in FIG. 3G, a predetermined portion of the second auxiliary electrode 210 is etched by using the first photoresist pattern 410 as a mask.

In detail, one side and the other side of the second auxiliary electrode 210, which are not covered by the first photoresist pattern 410, are etched away. In this instance, the second lower auxiliary electrode 211 is not etched, but the second central auxiliary electrode 212 and the second upper auxiliary electrode 213 are etched. That is, under the condition that the first photoresist pattern 410 is used as the mask, the second upper auxiliary electrode 213 is etched first, and then the second central auxiliary electrode 212 is etched. Thus, the second lower auxiliary electrode 211 is not etched. However, if needed, the second lower auxiliary electrode 211 may be partially etched.

After the etching process, the width of the second upper auxiliary electrode 213 may be the same as the width of the first photoresist pattern 410, however, the width of the second central auxiliary electrode 212 provided under the second upper auxiliary electrode 213 may be smaller than the width of the first photoresist pattern 410. Accordingly, the width of the second upper auxiliary electrode 213 obtained after the etching process may be larger than the width of the second central auxiliary electrode 212 obtained after the etching process.

The second anode electrode 200 is covered by the second photoresist pattern 420, whereby the second anode electrode 200 is not etched by the etching process of the second auxiliary electrode 210.

Figure 3H:
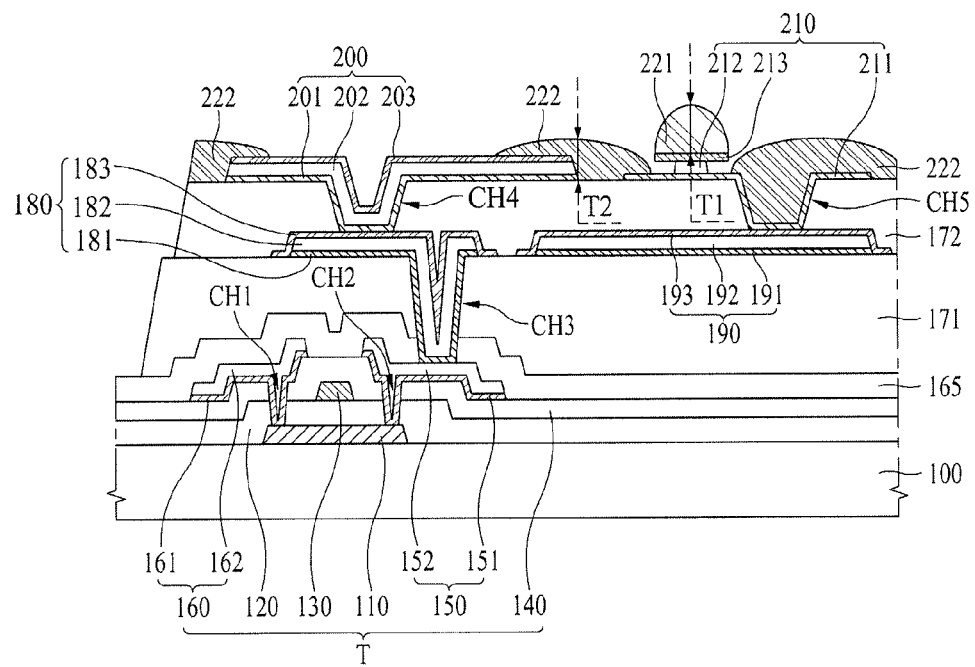

Then, as shown in FIG. 3H, the first photoresist pattern 410 and the second photoresist pattern 420 are removed, and then the banks 221 and 222 are provided on the second auxiliary electrode 210 and the second anode electrode 200, respectively.

The banks 221 and 222 can include the first bank 221 provided on the upper surface of the second upper auxiliary electrode 213 of the second auxiliary electrode 210, and the second bank 222 provided on the remaining regions. The second bank 222 is provided on the upper surface of the second anode electrode 200, and provided on the upper surface of the second lower auxiliary electrode 211 of the second auxiliary electrode 210.

The thickness (t2) of the second bank 222 is smaller than the thickness (t1) of the first bank 221. Since the thickness (t2) of the second bank 222 is smaller than the thickness (t1) of the first bank 221, it facilitates the electrical connection between the second auxiliary electrode 210 and the cathode electrode (See 250 of FIG. 3K) in the gap space between the first bank 221 and the second bank 222.

Figure 3I:
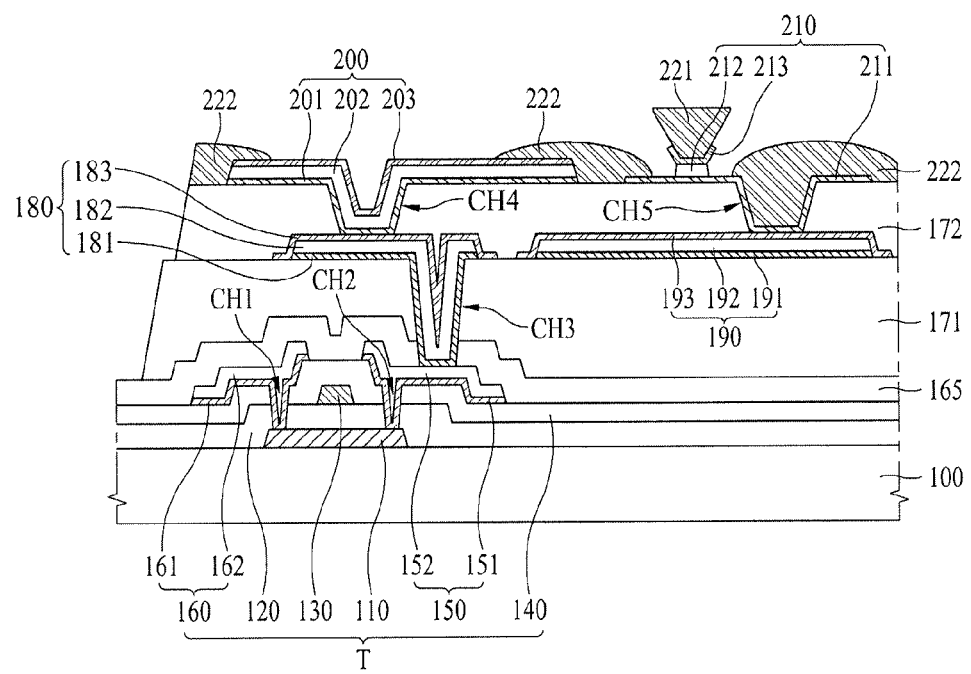
Figure 3J:
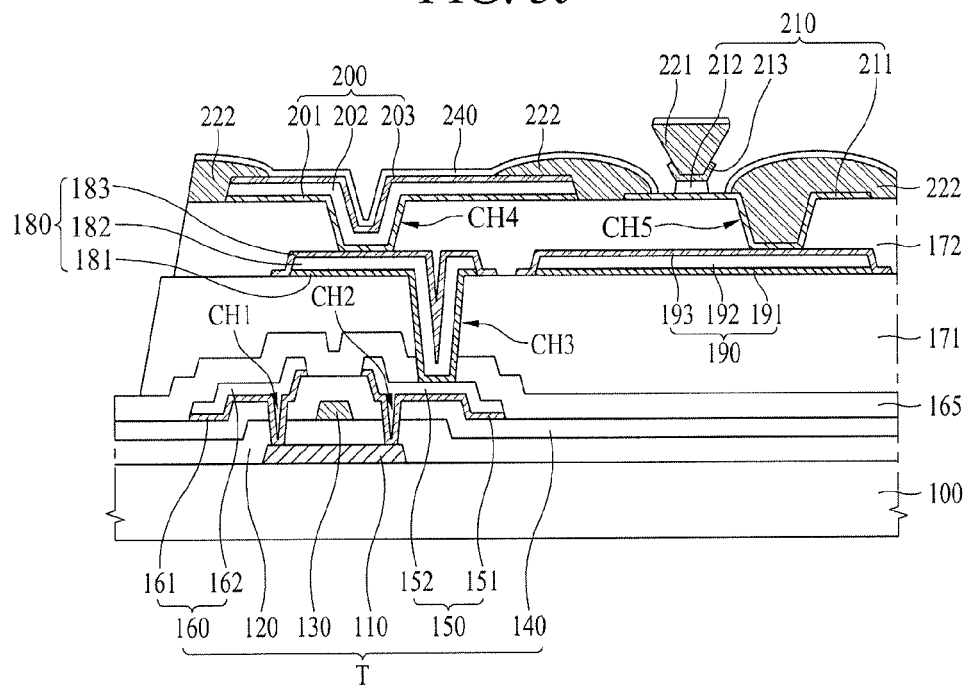
Figure 3K:
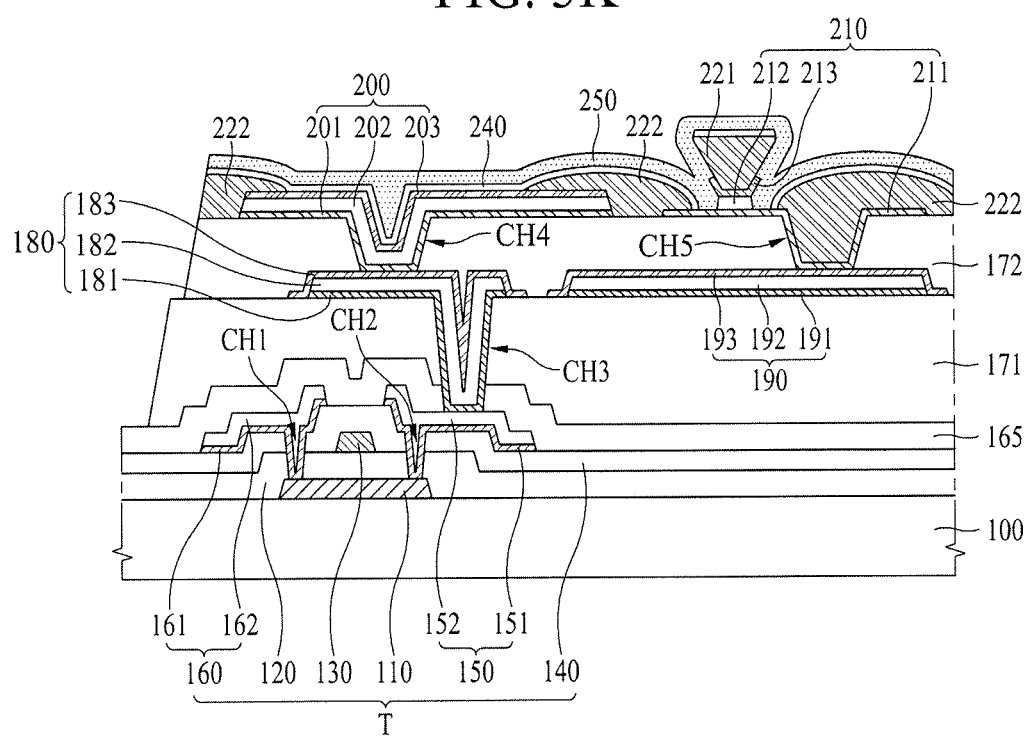

That is, if the thickness (t2) of the second bank 222 is large, the interval between the first bank 221 and the second bank 222 becomes small, whereby the cathode electrode (See 250 of FIG. 3K) might be not deposited in the gap space between the first bank 221 and the second bank 222 for the following process of FIG. 3K. Thus, in order to prevent this problem, the thickness (t2) of the second bank 222 is smaller than the thickness (t1) of the first bank 221. The first bank 221 and the second bank 222 which have the different thicknesses can be manufactured by one exposure through the use of half-tone mask or diffraction mask.

Then, as shown in FIG. 3I, a thermal treatment is carried out to induce a thermal stress between the first bank 221 and the second upper auxiliary electrode 213 provided below the first bank 221. That is, the first bank 221 shrinks as it is heated so that both ends of the lower surface of the first bank 221 are decreased in width. Accordingly, both ends of the second upper auxiliary electrode 213 upwardly extend along the lower surface of the first bank 221 (e.g., heating the first bank 221 causes the ends of the second upper auxiliary electrode 213 to bend upward, thus forming a type of cup around the bottom tip of the first bank 221).

By the aforementioned process, the width in the upper surface of the first bank 221 is larger than the width in the lower surface of the first bank 221, whereby it is possible to obtain the structure of eaves in the first bank 221. For example, the first bank 221 can have a reverse tapered shape or form a mushroom shape. Owing to the structure of eaves, the gap space between the first bank 221 and the second bank 222 is covered by the upper surface of the first bank 221 (e.g., the overhanging part of the first bank 221). Thus, it is possible to prevent the organic emitting layer 240 from being deposited in the gap space between the first bank 221 and the second bank 222 for the following deposition process of the organic emitting layer 240.

Then, as shown in FIG. 3J, the organic emitting layer 240 is provided on the second anode electrode 200.

The organic emitting layer 240 may be manufactured by an evaporation method using a deposition material with superior straightness. Thus, the organic emitting layer 240 can be deposited on the upper surface of the banks 221 and 222. However, it is possible to prevent the organic emitting layer 240 from being deposited in the gap space between the first bank 221 and the second bank 222. That is, the upper surface of the first bank 221 serves as the eaves for the deposition process of the organic emitting layer 240, whereby it is possible to prevent the organic emitting layer 240 from being deposited in the gap space between the first bank 221 and the second bank 222 for the deposition process of the organic emitting layer 240 without using the mask pattern of covering the upper surface of the second lower auxiliary electrode 211.

However, some of the organic emitting layer 240 may be deposited in the gap space between the first bank 221 and the second bank 222. Even in this instance, all of the second lower auxiliary electrode 211 is not covered by the organic emitting layer 240.

As shown in FIG. 3K, the cathode electrode 250 is provided on the organic emitting layer 240.

The cathode electrode 250 is connected to the second auxiliary electrode 210 via the gap space between the first bank 221 and the second bank 222. The cathode electrode 250 can be manufactured by sputtering, that is, a deposition process using a deposition material with inferior straightness. Accordingly, the cathode electrode 250 can be deposited in the gap space between the first bank 221 and the second bank 222 for the deposition process of the cathode electrode 250. Especially, the cathode electrode 250 can be respectively connected with the second lower auxiliary electrode 211, the second central auxiliary electrode 212, and the second upper auxiliary electrode 213 constituting the second auxiliary electrode 210.

According to one embodiment of the present invention, the first bank 221 provided on the second auxiliary electrode 210 is configured to have the structure of eaves so that it is possible to omit the additional mask process for forming the partition according to the related art.

According to one embodiment of the present invention, there are the two auxiliary electrodes including the first auxiliary electrode 190 and the second auxiliary electrode 210 for lowering the resistance of the cathode electrode 250, in order to easily control the resistance properties of the auxiliary electrode. Especially, the first auxiliary electrode 190 is connected with the second auxiliary electrode 210 via the contact hole and the first auxiliary electrode 190 is provided below the second auxiliary electrode 210 so that it is possible to lower the resistance of the cathode electrode 250 without decreasing the pixel region.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An organic light emitting display (OLED) device comprising:
   a substrate;
   an anode electrode on the substrate;
   an organic emitting layer on the anode electrode;
   a cathode electrode on the organic emitting layer;
   an auxiliary electrode connected with the cathode electrode;
   a first bank on an upper surface of the auxiliary electrode; and
   a second bank disposed between the auxiliary electrode and the anode electrode, wherein the second bank is formed of a same material as the first bank, and the first and second banks are spaced apart from each other,
   wherein a width of an upper surface of the first bank is larger than a width of a lower surface of the first bank, and the cathode electrode is connected with the auxiliary electrode via a gap space between the first bank and the second bank.

2. The OLED device according to claim 1, wherein the first bank and a portion of the auxiliary electrode form a partition having a reverse tapered shape that narrows towards a bottom of the partition, and
   wherein the partition has eaves and the cathode electrode is connected to the auxiliary electrode in an area under the eaves of the partition.

3. The OLED device according to claim 1, wherein the portion of the auxiliary electrode forms a base of the partition and the first bank forms an upper portion of the partition.

4. The OLED device according to claim 1, wherein the auxiliary electrode includes a lower auxiliary electrode, a central auxiliary electrode, and an upper auxiliary electrode.

5. The OLED device according to claim 4, wherein a width of the lower auxiliary electrode is larger than a width of each of the central auxiliary electrode and the upper auxiliary electrode, and the width of the central auxiliary electrode is smaller than the width of the upper auxiliary electrode.

6. The OLED device according to claim 4, wherein both ends of the upper auxiliary electrode upwardly extend along a lower surface of the first bank.

7. The OLED device according to claim 4, wherein the first bank is provided on an upper surface of the upper auxiliary electrode, and the second bank is provided on an upper surface of the lower auxiliary electrode.

8. The OLED device according to claim 1, wherein a thickness of the first bank is larger than a thickness of the second bank.

9. The OLED device according to claim 1, wherein the anode electrode includes a first anode electrode, and a second anode electrode connected with the first anode electrode via a contact hole,
   wherein the auxiliary electrode includes a first auxiliary electrode, and a second auxiliary electrode connected with the first auxiliary electrode via a contact hole, and
   wherein the first bank is provided on the second auxiliary electrode, and the second bank is provided between the second auxiliary electrode and the second anode electrode.

10. The OLED device according to claim 9, wherein a width of the first auxiliary electrode is larger than a width of the first anode electrode, and the first auxiliary electrode overlaps with the second anode electrode.

11. The OLED device according to claim 9, wherein a width of the second anode electrode is larger than a width of the first anode electrode, and the second anode electrode overlaps with the first auxiliary electrode.

12. The OLED device according to claim 9, wherein the first auxiliary electrode or the second auxiliary electrode comprises a layered structure including a central auxiliary electrode disposed between an upper auxiliary electrode and a lower auxiliary electrode, and
   wherein the upper and lower auxiliary electrodes include a material having a higher corrosion resistance than the central auxiliary electrode, and the central auxiliary electrode includes a material having a lower electrical resistance than the upper and lower auxiliary electrodes.

13. The OLED device according to claim 12, wherein the upper auxiliary electrode of the first auxiliary electrode covers lateral surfaces of the central and lower auxiliary electrodes of the first auxiliary electrode.

14. The OLED device according to claim 1, wherein the auxiliary electrode comprises a first auxiliary electrode and a second auxiliary electrode, and the second auxiliary electrode overlaps with and connects to the first auxiliary electrode,
   wherein the anode electrode comprises a first anode electrode and a second anode electrode, and the second anode electrode overlaps with and connects to the first auxiliary electrode, and
   wherein the first or second anode electrode is formed on a same layer as the first or second auxiliary electrode.

15. An organic light emitting display (OLED) device comprising:
   an organic emitting layer disposed on a first pixel electrode;
   a second pixel electrode disposed on the organic emitting layer;
   an auxiliary electrode connected with the second pixel electrode;
   a first bank disposed on the auxiliary electrode;
   a second bank including a first portion and a second portion, wherein the first and second portions of the second bank are disposed on sides of the first bank and on ends of the auxiliary electrode; and a gap space between the first bank and the first or second portion of the second bank, wherein the auxiliary electrode connects to the second pixel electrode in the gap space between the second bank and the first or second bank portion.

16. The OLED device according to claim 15, wherein the first bank and a portion of the auxiliary electrode form a partition having a reverse tapered shape that narrows towards a bottom surface of the partition, and wherein the partition has eaves and the cathode electrode is connected to the auxiliary electrode in an area under the eaves of the partition.

17. The OLED device according to claim 15, wherein the first bank and the second bank are made from a same material.

* * * * *